United States Patent [19]

Schweitzer, Jr.

[11] 4,045,726

[45] Aug. 30, 1977

[54] TOOL FOR MANUALLY TRIPPING A FAULT INDICATOR FOR HIGH VOLTAGE ELECTRIC POWER CIRCUITS AND RESETTING SAME

[76] Inventor: Edmund O. Schweitzer, Jr., 1002 Dundee Road, Northbrook, Ill. 60062

[21] Appl. No.: 702,886

[22] Filed: July 6, 1976

[51] Int. Cl.² .................... G01R 31/02; G01R 19/16; G08B 21/00
[52] U.S. Cl. ..................................... 324/51; 324/133; 340/253A
[58] Field of Search .................. 324/51, 127, 133, 67; 340/253 R, 253 A

[56] References Cited

U.S. PATENT DOCUMENTS

| | | | |
|---|---|---|---|
| 3,418,572 | 12/1968 | Humphreys | 324/67 |
| 3,866,197 | 2/1975 | Schweitzer | 324/133 X |
| 3,876,911 | 4/1975 | Schweitzer | 324/133 X |
| 3,906,477 | 9/1975 | Schweitzer | 340/253 A |
| 3,974,446 | 8/1976 | Schweitzer | 324/51 X |
| 3,991,366 | 11/1976 | Schweitzer | 340/253 A X |

Primary Examiner—Gerard R. Strecker
Attorney, Agent, or Firm—Lockwood, Dewey, Zickert & Alex

[57] ABSTRACT

This invention relates, generally, to fault indicators and it has particular relation to tools for testing fault indicators of the kind and character disclosed in my U.S. Pat. No. 3,906,477, issued Sept. 16, 1975.

5 Claims, 6 Drawing Figures

U.S. Patent    Aug. 30, 1977    4,045,726
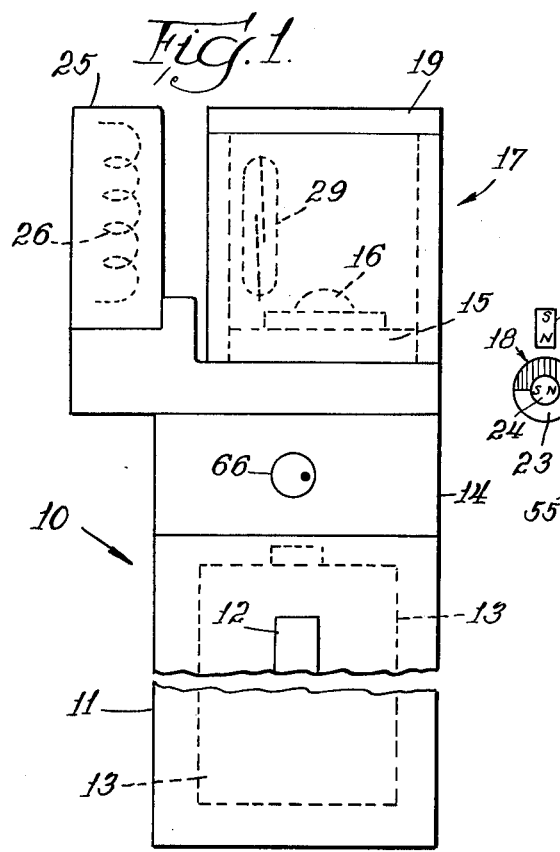
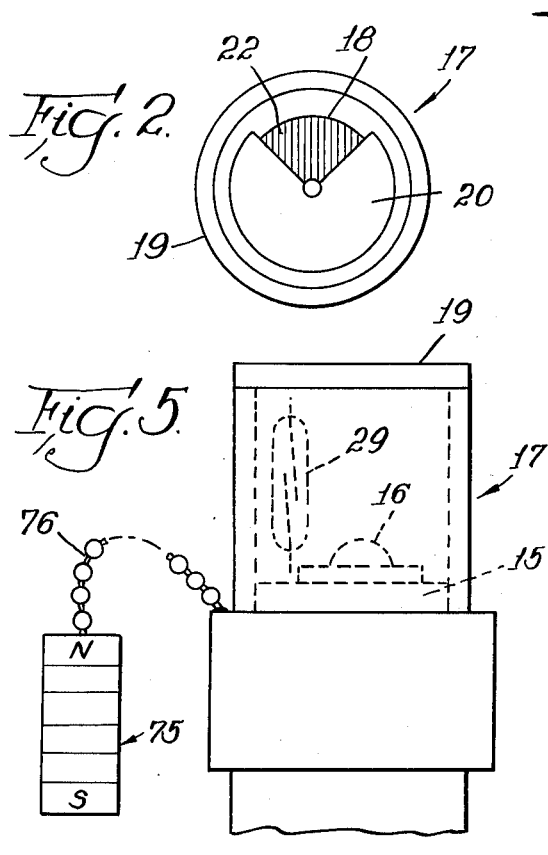
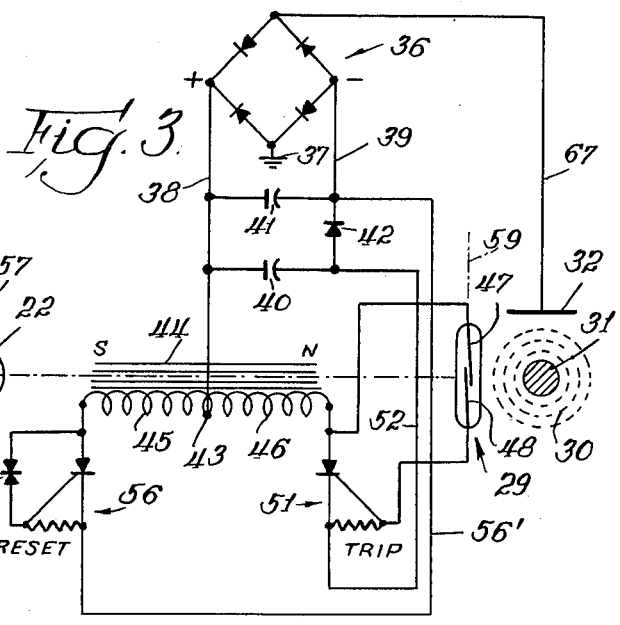
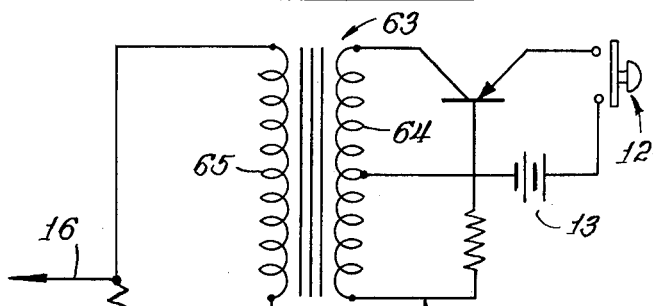
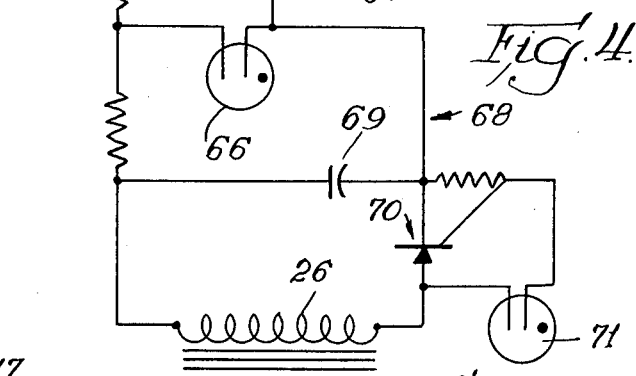
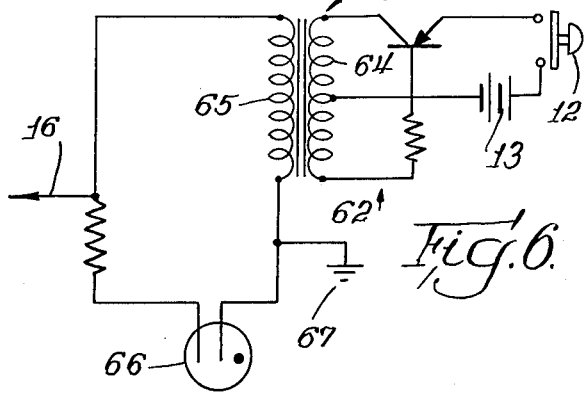

TOOL FOR MANUALLY TRIPPING A FAULT INDICATOR FOR HIGH VOLTAGE ELECTRIC POWER CIRCUITS AND RESETTING SAME

Among the objects of this invention are: to provide for manually testing the operability of a fault indicator normally applied to the test point of a high voltage alternating current plug-in connector; to employ relatively low voltage means for this purpose; to employ a tool generally in the form and shape of a conventional tubular flashlight for this purpose; to arrange for mounting the fault indicator on a fitting on the flashlight congruent therewith; to provide for generating a magnetic field for tripping the fault indicator to fault indicating position; to generate the magnetic field either by periodic discharge of a capacitor through a winding or by a permanent magnet; to provide for resetting the fault indicator by generating a reset voltage by means of a battery operated oscillator; and to arrange for the capacitor to be discharged at a rate slower than the time required for the voltage to reset the fault indicator.

In the drawing:

FIG. 1 is a view in side elevation of a test tool for fault indicators in which this invention is embodied, a fault indicator being illustrated in operative test position;

FIG. 2 is a top plan view of the fault indicator shown in FIG. 1;

FIG. 3 shows, diagrammatically, the circuit connections in the fault indicator as illustrated in the above-mentioned patent;

FIG. 4 shows, diagrammatically, the circuit connections in the test tool shown in FIG. 1;

FIG. 5 shows a modification of the test tool in which a permanent magnet is employed to generate the magnetic field for tripping the fault indicator; and, FIG. 6 shows, diagrammatically, the circuit connections for the oscillator to generate the reset voltage for the test tool shown in FIG. 5.

Referring now to FIG. 1, reference character 10 designates, generally, a test tool in which this invention is embodied. It includes a tubular flashlight housing 11 provided with a push button 12 and containing dry cell batteries 13. Other housing arrangements can be employed. At its upper end the housing 11 has a sleeve 14 that is provided with a fitting 15 from which a test point contact 16 extends upwardly. The test point contact 16 corresponds to the high voltage test point terminal of the plug-in connector disclosed in the above patent. The fitting 15 is congruent with a fault indicator, shown generally at 17, which is arranged to indicate whether fault current has flowed through the plug-in connector. The test tool 10 is arranged and adapted to check on the operability of the fault indicator 17 before installation on the plug-in connector or on removal therefrom.

As is shown in FIGS. 2 and 3 the fault indicator 17 includes a pivoted target disc 18 that is located underneath a transparent cover 19 and partly underneath a a mask 20 which permits visability of either a red section 22 or a white section 23, the red section 22, when visible through the transparent cover 19, indicating that fault current has flowed while the white section 23, when visible through the transparent cover 19, indicating that less than fault current has flowed. A permanent magnet 24 is secured to the target disc to effect pivotal movement thereof in a manner to be described.

As shown in FIG. 1, the sleeve 14 has an integral upstanding housing 25 in which is located a winding 26 that is juxtaposed to a reed switch 29 forming a part of the circuitry of the fault indicator 17 as shown in FIG. 3. Physically the longitudinal axes of winding 26 and of the reed switch 29 extend parallel to each other, as shown, but at right angles to the plane of the drawing. However, for illustrative purposes they are shown in the plane of the drawing. In normal operation of the fault indicator 17, the reed switch 29 is closed by a magnetic field 30 generated by flow of fault current through a conductor 31 in the plug-in connector as described in the above patent. In accordance with this invention current is caused to flow through the winding 26 to generate a magnetic field to close the reed switch 29 in checking operability of the fault indicator 17 as described hereinafter. The fault indicator 17 includes a test point 32 for contact engagement with the test point contact 16 when the fault indicator 17 is applied to the test tool 10 as shown in FIG. 1.

The circuitry in the fault indicator 17 is shown in FIG. 3. It includes a full wave rectifier 36 which is connected between the test point 32 and ground 37. Conductors 38 and 39 are energized to the polarities indicated from the rectifier 36 for charging first and second capacitors 40 and 41, capacitor 40 being charged through a blocking diode 42. Conductor 38 is connected to the center tap of a winding 43 on a magnetic core 44 that has a reset section 45 and a trip section 46. Normally, open contacts 47 and 48 of the reed switch 29 are connected across an SCR 51 which is rendered conducting on closure of these contacts when fault current flows in conductor 31. Current then flows from both capacitors 40 and 41 over conductor 52 and through trip section 46 to magnetize core 44 with the polarities indicated to shift the target disc 18 to the fault indicating position shown in FIG. 3.

Normally, the fault indicator 17 is automatically reset on restoration of energization of conductor 31. Capacitors 40 and 41 are recharged until a trigger diode 55 is rendered conducting whereupon SCR 56 becomes conducting and current flows from capacitor 41 over conductor 56' and through reset section 45 to reverse the polarity of the core 44 to shift the target disc 18 to expose the white section 23 to view.

A stationary permanent magnet 57 acts to center the target disc 18 in either of its operative positions. The longitudinal axis 58 of the core 44 is perpendicular to the magnetic field 30 around conductor 31 to avoid demagnetization of the core 44. The longitudinal axis 59 of the reed switch 29 is generally parallel to the magnetic field 30 around conductor 31 to effect closure of contacts 47 and 48 only when fault current flows in conductor 31.

FIG. 4 shows the circuitry in the test tool 10 that simulates operation of the fault indicator 17 to check its operability. On closure of the contacts of push button 12, a circuit is completed from batteries 13 to energize an oscillator circuit that is shown generally at 62. This circuit includes a transformer, shown generally at 63, which includes a center tapped primary winding 64 and a high voltage secondary winding 65 that is connected to test point 16. To indicate that the oscillator circuit 62 is operating a neon lamp 66 is connected between the winding 65 and ground 67 and is located in the sleeve 14, FIG. 1, where it is visible by the operator.

It will be understood that the fault indicator 17, when mounted on the test tool 10 as shown in FIG. 1, is reset when the oscillator circuit 62 is energized and reset potentialis applied from the test point 16 to the test point 32.

The oscillator circuit 62 is connected to energize a fault current simulating circuit that is shown, generally, at 68 in FIG. 4. This circuit 68 includes a capacitor 69 that is alternately charged and discharged through winding 26 by SCR 70 under the control of a neon lamp 71. The arrangement is such that the capacitor 69 discharges periodically to energize winding 26 and close contacts 47 and 48 of the reed switch 29 at a rate slower than the reset time of the fault indicator 17 under the control of the potential applied to the test point 16.

FIG. 5 illustrates how a permanent magnet 75 can be employed in lieu of the winding 26 to generate a magnetic field for closing the contacts 47 and 48 of the reed switch 29. This magnetic field corresponds to the magnetic field 30 generated by flow of fault current through conductor 31. A non-magnetic tie, such as a brass chain 76 secures the magnetic 75 to the test tool 10.

FIG. 6 shows that portion of the circuitry in the test tool 10, a duplicate of a portion of the circuitry shown in FIG. 4, that is employed to generate the necessary reset voltage for the fault indicator 17.

I claim:

1. A test tool for a fault indicator having a magnetically operable reed switch arranged to be positioned generally parallel to the alternating magnetic field generated around a conductor by flow of alternating fault current therein to operate an indicator to fault indicating position and a circuit responsive to the voltage at which said conductor is energized to reset said indicator to non-fault indicating position including a test point, said test tool comprising a unitary structure including a winding having a longitudinal axis arranged to be placed generally parallel and juxtaposed to the longitudinal axis of said reed switch, a test point contact to engage said test point, means for energizing said winding with alternating current to generate a magnetic field for closing said reed switch to operate said indicator to said fault indicating position, and means for applying a voltage to said test point contact to energize said circuit to reset said indicator.

2. A test tool according to claim 1 wherein said magnetic field of said test tool is generated by current flow from a capacitor through said winding, and said voltage of said test tool is generated by an oscillator also arranged to charge said capacitor.

3. A test tool according to claim 2 wherein said capacitor is arranged to discharge periodically at a rate slower than the rate at which said indicator is reset by said voltage from said oscillator.

4. A test tool according to claim 1 wherein said test tool includes a sleeve having a fitting from which said test point contact extends and which is congruent to said fault indicator.

5. A test tool according to claim 4 wherein said winding is disposed in a housing integral with said sleeve.

* * * * *